United States Patent [19]

Hedström

[11] Patent Number: 5,445,973
[45] Date of Patent: Aug. 29, 1995

[54] METHOD FOR MANUFACTURING SOLAR CELLS

[75] Inventor: Jonas Hedström, Stockholm, Sweden

[73] Assignee: IM Institute For Mikroelektronik, Sweden

[21] Appl. No.: 137,156
[22] PCT Filed: Apr. 22, 1992
[86] PCT No.: PCT/SE92/00262
  § 371 Date: Oct. 22, 1993
  § 102(e) Date: Oct. 22, 1993
[87] PCT Pub. No.: WO92/20103
  PCT Pub. Date: Nov. 12, 1992

[30] Foreign Application Priority Data

Apr. 24, 1991 [SE] Sweden ............... 9101246

[51] Int. Cl.$^6$ ............. H01L 31/18; H01L 31/0264
[52] U.S. Cl. .................. 437/5; 136/265; 427/76; 118/727; 118/730
[58] Field of Search ............ 136/265; 437/5; 118/730, 726, 727; 427/255.1, 75, 76

[56] References Cited

U.S. PATENT DOCUMENTS

| | | | |
|---|---|---|---|
| 1,551,850 | 9/1925 | Schmidner et al. | 118/726 |
| 2,729,190 | 1/1956 | Pawlyk | 118/730 |
| 2,885,997 | 5/1959 | Schwindt | 118/730 |
| 4,121,537 | 10/1978 | Maruyama et al. | |
| 4,335,266 | 6/1982 | Mickelsen et al. | 136/265 |
| 4,392,931 | 6/1983 | Maniv et al. | |
| 4,508,748 | 4/1985 | Ericsson | 427/76 |
| 4,583,488 | 4/1986 | Brown et al. | 118/730 |
| 4,851,095 | 6/1989 | Scobey et al. | |
| 4,904,362 | 2/1990 | Gaertner et al. | |
| 5,154,810 | 10/1992 | Kammerling et al. | 118/730 |

FOREIGN PATENT DOCUMENTS

WO820245 7/1982 WIPO.
WO890123 2/1989 WIPO.

OTHER PUBLICATIONS

C. Nuccio et al., IBM Technical Disclosure Bulletin, 12, 9 (1970) 1433, "Enhancing Semiconductor reactions".

Primary Examiner—Brian E. Hearn
Attorney, Agent, or Firm—Nies, Kurz, Bergert & Tamburro

[57] ABSTRACT

A method for manufacturing solar cells, more specifically thin-film solar cells, particularly thin-film solar cells on which $CuInSe_2$ is deposited. A substrate is provided on which a multi-layer structure is formed by depositing thereon a layer defined by a compound including several basic substances, such as copper-indium-diselenide ($CuInSe_2$), or a closely-related compound where copper (Cu) and indium (In) can be replaced totally or partially with Silver (Ag) and gallium (Ga), respectively, and where selenium (Se) can be replaced totally or partially with sulphur (S) and tellurium (Te), and where the concentration of the basic substances in the layer varies. The substrate is placed on the inside of a rotatable, tubular carrier device, after which the substrate is heated, and substance sources are provided for depositing the basic substances on the substrate. One or more of the basic substances is deposited on the substrate by passing respective basic substance sources axially into the tubular carrier device while simultaneously rotating the tubular carrier device.

9 Claims, 1 Drawing Sheet

METHOD FOR MANUFACTURING SOLAR CELLS

BACKGROUND OF THE INVENTION

1. Field of the Invention

The present invention relates to a method for manufacturing solar cells, and more specifically thin-film solar cells.

2. Description of the Related Art

The technique used to produce thin-film solar cells is the PVD-technique (Physical Vapor Deposition), in which copper, indium and selenium are vaporized and deposited on a heated substrate. The substrate normally includes a glass plate on which a layer of molybdenum (Mo) is sputtered. The compound copper-indium-diselenide (CuInSe2) is formed on the substrate. A layer of cadmium sulphide (CdS) and a transparent electric contact in the form of doped zinc oxide (ZnO) are laid over a layer of cadmium sulphide (CdS).

Vaporization of the various substances takes place in a chamber. When the glass plate has large dimensions, the plate is positioned stationary in relation to the sources of the aforesaid substances.

Three problems are primarily encountered when producing thin-film solar cells based on CuInSe2 by means of vacuum deposition (PVD). This also applies with layer compositions other than just CuInSe2.

The first of these problems resides in the ability to produce layers on large surfaces in a manner which will provide a uniform layer. Thin-film solar cells normally have a size of 1×0.4 meters. The thickness of the CuInSe2-layer is particularly critical and should be uniform in order to achieve good functioning of the solar cell.

The second of the aforesaid problems is that the composition of the CuInSe2-layer should vary over its thickness, so that the composition of that part of the layer furthest away from the glass plate will contain more indium than is given by the stoichiometric composition. Correspondingly, that part of the layer which lies nearest the glass plate should contain a relatively higher percentage of copper. This is because of the desire to suppress the formation of so-called copper nodules on the upper boundary surface of the layer, since such nodules reduce the efficiency of the solar cell.

The known technique solves this problem by first applying a layer rich in copper and then applying to this first layer in a second process stage a second layer which is rich in indium. Application of a large quantity of indium suppresses the formation of a copper-rich surface, which in turn suppresses the formation of said nodules. This known technique thus requires two different process stages, thereby rendering the process complicated and expensive.

The third of the aforesaid problems resides in a relatively low yield of vaporized substances that are deposited on the substrate.

These problems are solved by means of the present invention.

SUMMARY OF THE INVENTION

The present invention thus relates to a method of manufacturing solar cells, more specifically thin-film solar cells, in which a multilayer structure is built-up on a substrate. The method includes steps of depositing a layer of a compound of several basic substances, such as copper-indium-diselenide (CuInSe2) or a closely related compound in which copper (Cu) and indium (In) can be replaced totally or partially with silver (Ag) or gallium (Ga) respectively, and where Se is replaced either totally or partially with sulphur (S) or tellurium (Te), and in which the concentration of the basic substances in the layer varies. The method is characterized in that the substrate is placed on the inside of a rotatable, generally circular carrier device; in that the substrate is heated; in that sources of the basic substances to be deposited on the substrate are present; in that one or more of the basic substances is/are deposited on the substrate by passing a respective source axially through the cylindrical carrier device; and in that the cylindrical carrier device and/or respective sources can be moved while rotating the cylindrical carrier device.

BRIEF DESCRIPTION OF THE DRAWINGS

The invention will now be described in more detail with reference to an exemplifying embodiment thereof illustrated in the accompanying drawing, in which.

DESCRIPTION OF THE PREFERRED EMBODIMENTS

Figure 1:
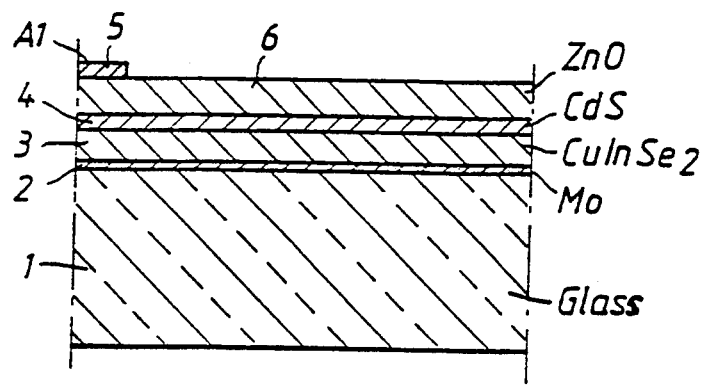
FIG. 1 is a schematic sectional view of a solar cell.

FIG. 1 is a schematic sectional view of a thin-film solar cell. Thin-film solar cells are constructed on substrates of relatively large sizes, for instance a size of 1×0.4 m. Such structures include a very large number of cells above the substrate surface, these cells bring mutually connected electrically. FIG. 1 shows only a part of one such cell. The technique of manufacturing a large number of mutually separate, but electrically connected cells on a substrate surface is well known and will not be described here.

The substrate 1 is normally a glass plate of suitable thickness, generally 3 mm. A layer 2 of molybdenum (Mo) is first sputtered onto the glass surface. The molybdenum layer forms an electric back-contact and positive pole, or terminal, in the finished cell. The molybdenum layer may have a thickness of, e.g., 0.5 micrometer. There is then applied to the molybdenum layer a layer 3 of CuInSe2, having a thickness of 2 micrometers, for instance. There is then applied onto the layer 3 a first layer 4 of cadmium sulphide (CdS) to a thickness of from 5 to 500 Å for instance, and then an electrical contact in the form of a transparent, doped zinc oxide layer (ZnO) 6 which is applied to a thickness of from 1 to 2 micrometers, for instance. A metallic contact 5 made of aluminium for instance may also be used.

When sunlight falls on the solar cell, an electric voltage will occur between the contact 6 (ZnO), which is a minus pole, and the back contact 2.

As before mentioned, the present invention relates to a method for manufacturing solar cells, more specifically thin-film solar cells, in which a multi-layer structure is built-up on a substrate, said method comprising the steps of depositing a layer consisting of a compound of several basic substances, such as copper-indium-diselenide (CuInSe2) or a closely related compound in which copper (Cu) and indium (In) can be replaced totally or partially with silver (Ag) and gallium (Ga) respectively, and in which Se can be replaced totally or partially with sulphur (S) or tellurium (Te), where the concentration of the basic substances in the layer varies.

More specifically, the present invention relates to a method for manufacturing thin-film solar cells in which a layer of copper-indium-diselenide (CuInSe2) is deposited and in which the concentration of copper and indium respectively vary in the layer for the reasons given in the introduction.

The present invention is described below with reference to an exemplifying embodiment thereof in which a layer of CuInSe2 is deposited, although it will be understood that the invention is not restricted to such a layer but can be applied for depositing layers which comprise other basic substances.

Figure 2:
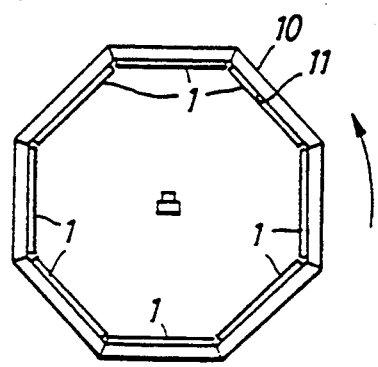
FIG. 2 is a schematic, axial view of an arrangement for carrying out the invention.

According to the invention, the substrate 1 is placed on an inner surface 11 of a rotatable, generally cylindrical carrier device 10, as illustrated schematically in FIG. 2. The whole of the carrier device 10 is placed in a vacuum chamber 12 (see FIG. 3) of a suitable known kind. The molybdenum layer 2 has been applied to the substrate previous to placing the substrate on the carrier device 10.

The carrier device 10 may have any suitable construction. For instance, it may comprise a framework of steel beams provided with glass-plate or substrate attachment devices.

Figure 3:
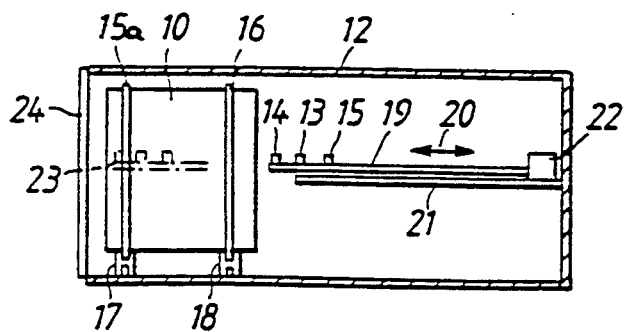
FIG. 3 is a schematic side view of the arrangement.

The arrangement as shown in FIG. 3 includes a selenium source 13 from which selenium is deposited onto the substrate. The position of the selenium source is not critical. Nevertheless, selenium will be present in sufficient concentration in the chamber atmosphere.

The CuInSe2-layer 3 is deposited, by passing a copper source and an indium source axially through the cylindrical carrier device 10 while the device is rotated about its own axis. The sources and the carrier device preferably move continuously in relation to one another, with the substance sources moving from one open end of the carrier device to its other end.

Movement of the sources 14, 15 through the carrier device may be effected by moving the cylindrical carrier device 10 and/or the sources 14, 15.

When depositing the basic substances, the sources 13, 14, 15 are heated so as to generate in the chamber an atmosphere of predetermined composition, in a known manner. The substrate is heated to a temperature of 300°–600° C.

FIG. 3 illustrates schematically only one conceivable embodiment of the mechanical part of the arrangement. The carrier device 10 may be provided with circular beams 15, a 16 which extend around the periphery of said device and rest on rollers 17, 18. The rollers 17, 18 may be driven, for rotation of the carrier device 10. The sources 13, 14, 15 may be mounted on a rod 19 which can be moved in relation to a carrier arm 21 in the directions indicated by the arrow 20. For instance, a ball screw may be fixedly mounted in relation to the carrier arm 21, which coacts with a drive unit 22 fixedly connected to the rod 19. The rod is moveable between the rear position shown in full lines in FIG. 3 and the forward position shown in broken lines 23.

The chamber 12 has a door 24.

The sources may be stationarily mounted instead of being moveable, and the carrier device mounted for movement in the direction of its geometric axis.

Because, in accordance with the invention, the CuInSe2-layer 3 is deposited by moving a copper source and an indium source at a uniform speed axially through the carrier device 10 while rotating the carrier device 10 about its own axis, a uniform layer will be deposited despite the sources delivering their respective basic substances, in accordance with a given space distribution.

According to a much preferred embodiment, the copper source and the indium source are spaced apart at a predetermined distance in their movement directions. Furthermore, the copper source 14 is brought into position first and then the indium source 15.

Because the copper source and the indium source are placed at predetermined distance apart and the copper source 14 is brought into position first and then the indium source 15, the amount of copper deposited on the substrate structure will initially be greater than the amount of indium that is deposited, i.e. a larger amount of copper nearest the substrate, whereafter the amount of indium deposited will be greater than the amount of copper deposited. This means that the CuInSe2-layer 3 will be richer in copper nearest the substrate and richer in indium nearest the CdS-layer 4.

According to one preferred embodiment of the invention, the distance between the copper source and the indium source is in the order of 10% to 25% of the radius of the carrier device.

According to a much preferred embodiment, deposition is effected by moving the copper source and the indium source relative to the carrier device solely once in one direction. In the case of the aforesaid dimensions, this means that the sources will move continuously through the carrier device over a time period of 30 minutes.

Alternatively, the sources may be moved backwards and forwards several times and the temperatures of respective sources controlled so as to obtain a copper-rich layer nearest the substrate and an indium-rich layer on the opposing surface. It is extremely difficult, however, to achieve sufficient reproducibility with this particular technique.

In that case in which the sources are moved only once through the carrier device and then returned to their aforesaid withdrawn position, the temperature of the sources is decreased so no substance will be deposited when the sources are withdrawn through the carrier device, back to their original positions.

According to one preferred embodiment, the cylindrical carrier device is rotated at a speed greater than about 1 to 5 r.p.m.

According to another preferred embodiment, the circumferential inner surface of the cylindrical carrier device is essentially covered with substrate, preferably planar substrate, such as to form a polygonal cross-section; see FIG. 2 in which the substrates form an eight-sided figure in cross-section. This greatly increases the yield of the quantity of substances delivered by the sources to the quantity of substances deposited on the substrate in comparison with the known technique. The yield is troublesomely low in the case of the known technique.

According to a further preferred embodiment, the length of the cylindrical carrier device corresponds to the length of a solar cell panel, i.e. about 1 meter, and a diameter such that a substrate having a width of 0.4 meter will form a polygon when seen in cross-section, preferably a hexagonal or decagonal figure.

It will be obvious from the aforegoing that the present invention solves the three problems mentioned in the introduction. Consequently, the present invention provides an inexpensive and quick method of manufacturing thin-film solar cells of very high quality.

The invention, however, is not restricted to the deposition of CuInSe2, but may also be used in conjunction with other related compounds where copper is replaced totally or partially with silver and in which indium is replaced solely or partially with gallium, and where selenium is replaced totally or partially with sulphur, or tellurium may be used.

Although the invention has been described with reference to a number of exemplifying embodiments thereof, it will be obvious that the carrier device and also the means for supporting the substance sources may be constructed in other ways suitable for carrying out the inventive method. Furthermore, the sources may be positioned other than immediately behind one another. The above-mentioned dimensions and speeds may also be adapted to suit prevailing conditions and are therefore not limited to the aforegiven values.

The present invention is therefore not restricted to the aforedescribed and illustrated exemplifying embodiments thereof, since these embodiments can be modified within the scope of the following claims.

I claim:

1. A method for manufacturing thin film solar cells including a substrate plate on which a multi-layer film of several substances is deposited by vacuum deposition, said method comprising:
   a. providing a generally tubular, rotatable substrate carrier having a longitudinal axis and an inner peripheral surface for supporting substrate materials to be substantially uniformly coated with a thin film of the several substances;
   b. positioning a plural of plates formed from the substrate material on the inner peripheral surface of the tubular substrate carrier;
   c. providing a plurality of substance sources containing substances to be deposited on the substrate plates, wherein the substance sources are spaced from each other along a line that extends in the direction of the substrate carrier longitudinal axis, to provide a desired composition gradient of the respective substances in the film thickness direction, the composition gradient being substantially uniform over the coated surface of the substrate;
   d. heating the substrate materials and the substance sources;
   e. moving the tubular substrate carrier and the substance sources relative to each other in a single movement in a single, axial direction during a deposition operation to being the substance sources within the inner peripheral surface of the tubular substrate carrier; and
   f. rotating the tubular substrate carrier and the substance sources relative to each other to deposit substance source material on an inwardly facing surface of the substrate in a substantially uniform layer.

2. A method according to claim 1, wherein the substance source include a copper source, an indium source, and a selenium source, and wherein a layer of copper-indium-diselenide (CuInSe2) is deposited on the substrate, and in which the concentration of copper and of indium in said layer are different in a layer thickness direction including the step of depositing the CuInSe2-layer by passing the copper source and the indium source axially through the tubular substrate carrier.

3. A method according to claim 2, wherein the copper source is introduced into the tubular substrate carrier first and then the indium source thereafter.

4. A method according to claim 1, wherein substantially the entire inner peripheral surface of the tubular substrate carrier is covered with substrate material to form a polygon in cross-section.

5. A method according to claim 2, wherein the copper source and the indium source are moved linearly relative to the tubular substrate carrier only once and in one direction.

6. A method according to claim 1, wherein the tubular substrate carrier is rotated at a speed greater than about 1 r.p.m.

7. A method according to claim 1, wherein the tubular substrate carrier has an axial length corresponding to a length of a solar cell panel, and a diameter such that a plurality of solar cell panels form a polygon when the carrier is viewed in cross-section, the polygon having at least six sides.

8. A method according to claim 7, wherein the distance between the copper source and the indium source is from about 10% to about 25% of the radius of the tubular substrate carrier.

9. A method according to claim 1 wherein the relative rotation of the tubular substrate carrier relative to the substrate sources and the relative linear movement between the tubular substrate carrier and the substance sources are performed simultaneously.

* * * * *

UNITED STATES PATENT AND TRADEMARK OFFICE
CERTIFICATE OF CORRECTION

PATENT NO. : 5,445,973
DATED : August 29, 1995
INVENTOR(S) : JONAS HEDSTROM

It is certified that error appears in the above-identified patent and that said Letters Patent is hereby corrected as shown below:

On the title page, correct item [73] to read:

[73] Assignee: IM Institutet For Mikroelektronik

On the title page, correct the following citations listed in item [56]:

[56]  4,392,931   7/1983   Maniv et al.
      4,583,488   4/1986   Brown Jr. et al..... 118/730
      4,851,095   7/1989   Scobey et al.
      5,154,810   10/1992  Kamerling et al..... 118/730

WO8202459   7/1982   WIPO
      WO8901238   2/1989   WIPO

At column 5, line 29, "plural" should be --plurality--.

At column 6, line 14, after "direction" insert --,--.

Signed and Sealed this

Thirty-first Day of October 1995

Attest:

BRUCE LEHMAN

*Attesting Officer*   *Commissioner of Patents and Trademarks*